United States Patent
Sharon et al.

(10) Patent No.: US 9,348,695 B2
(45) Date of Patent: May 24, 2016

(54) SYSTEM AND METHOD OF STORING REDUNDANCY DATA

(71) Applicant: SANDISK TECHNOLOGIES INC., Plano, TX (US)

(72) Inventors: Eran Sharon, Rishon Lezion (IL); Idan Alrod, Herzliya (IL)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/284,133

(22) Filed: May 21, 2014

(65) Prior Publication Data

US 2015/0339187 A1   Nov. 26, 2015

(51) Int. Cl.
*G11C 29/00*   (2006.01)
*G06F 11/10*   (2006.01)
*G11C 29/52*   (2006.01)
*G11C 29/04*   (2006.01)

(52) U.S. Cl.
CPC ............ *G06F 11/1068* (2013.01); *G06F 11/10* (2013.01); *G11C 29/52* (2013.01); *G11C 2029/0411* (2013.01)

(58) Field of Classification Search
CPC .......... H03M 13/1515; H03M 13/152; H03M 13/159; G06F 11/10; G06F 11/1068; G11C 29/52
USPC .......................................... 365/200; 714/763
See application file for complete search history.

(56) References Cited

U.S. PATENT DOCUMENTS

| 5,596,536 | A  | * | 1/1997 | Koh ..................... G11C 29/80 365/200 |
| 5,841,711 | A  | * | 11/1998 | Watanabe ............ G11C 29/789 365/189.07 |
| 7,315,480 | B2 | * | 1/2008 | Lee ..................... G11C 29/846 365/189.05 |
| 7,418,620 | B1 |   | 8/2008 | Tormasov et al. |
| 2007/0086252 | A1 | * | 4/2007 | Lim ..................... G11C 29/24 365/200 |
| 2010/0017649 | A1 |   | 1/2010 | Wu et al. |
| 2012/0079318 | A1 |   | 3/2012 | Colgrove et al. |
| 2012/0151286 | A1 |   | 6/2012 | Li et al. |
| 2012/0173936 | A1 |   | 7/2012 | Johnson et al. |
| 2013/0097376 | A1 | * | 4/2013 | Hall ..................... G06F 3/061 711/114 |

* cited by examiner

*Primary Examiner* — David Ton
(74) *Attorney, Agent, or Firm* — Toler Law Group, PC

(57) ABSTRACT

A data storage device includes a controller operatively coupled to a non-volatile memory. The non-volatile memory includes a plurality of blocks. When the controller is configured to operate according to a first mode, a portion of a first redundancy block of the plurality of blocks stores first redundancy data corresponding to a first group of multiple data portions. The multiple data portions stored in multiple blocks of the plurality of blocks. When the controller is configured to operate according to a second mode, the portion of the first redundancy block stores second redundancy data corresponding to a single block of the plurality of blocks.

24 Claims, 5 Drawing Sheets

US 9,348,695 B2

SYSTEM AND METHOD OF STORING REDUNDANCY DATA

FIELD OF THE DISCLOSURE

The present disclosure is generally related to storing redundancy data.

BACKGROUND

Non-volatile data storage devices, such as embedded memory devices (e.g., embedded MultiMedia Card (eMMC) devices) and removable memory devices (e.g., removable universal serial bus (USB) flash memory devices and other removable storage cards), have allowed for increased portability of data and software applications. Users of non-volatile data storage devices increasingly rely on the non-volatile storage devices to store and provide rapid access to a large amount of data.

Errors may occur in a memory, such as a flash memory, of a non-volatile data storage device. For example, random errors may occur due to various conditions, such as noise (e.g., a programming noise), a read disturb, cross-coupling effects, memory cell wear, etc. Alternatively or in addition, errors may occur due to physical memory defects (e.g., a broken wordline, a wordline-to-wordline short, etc.). Data storage devices may employ different types of protection schemes to protect against different types of errors (e.g., random errors or physical errors). The protection schemes may use redundant cells (e.g., "redundancy") to correct errors and maintain data integrity. The random errors may be corrected with an error correcting code (ECC) scheme and the physical errors may be corrected with a redundant array of disks type (RAID-type) scheme, such as a scheme that uses one or more exclusive- or (XOR) operations. For example, in an ECC scheme, one or more parity bits may be added to a data page to enable correction of random errors that may occur in the data page. In a RAID-type scheme, parity bits may be added across pages (e.g., across physical blocks). To illustrate, in a RAID-type scheme, multiple pages from different physical blocks may be XORed together and a resulting XOR page may be stored in another physical block.

The non-volatile data storage device may allocate a first portion of a storage capacity of the memory to store redundancy data for resolving random errors. For example, the first portion may be determined based on a bit error rate (BER) and/or a charge loss associated with an end-of-life condition of the non-volatile data storage device. Additionally, the non-volatile data storage device may allocate a second portion of the storage capacity of the memory to store redundancy data for resolving physical errors. For example, the second portion may be determined based on a defect rate associated with a beginning-of-life condition of the non-volatile data storage device. The first portion is distinct from the second portion and, accordingly, a relatively large portion of the memory of the non-volatile data storage device may be dedicated to correcting errors.

SUMMARY

Techniques are disclosed for storing redundancy data at a memory, such as a non-volatile memory, of a data storage device. A redundancy portion of the memory may be designated for storing the redundancy data. The redundancy portion may be allocated based on a mode (e.g., a redundancy mode) of the data storage device. The mode of the data storage device may be changed over a time (e.g., a life of the memory) to account for an amount of random errors and/or an amount of physical errors.

During the life of the memory of the data storage device, random errors (based on various noises (e.g., programming noise), program disturbs, read disturbs, cross-coupling effects, memory cell charge loss over time, memory cell wearing due to write/erase (W/E) cycle stresses, etc.) may increase with time and cycling. For example, when the memory is at a beginning-of-life, a number of random errors is small (e.g., a bit error rate (BER) level is low), but as more cycles occur over time, the number of random errors increases until an end-of-life of the memory. On the other hand, physical errors (originating from NAND defects, such as a broken wordline (WL), a WL-WL short, etc.) may decrease with time and cycling. To illustrate, many defects may be identified and flagged during production of the memory and, when defects appear during the life of the memory, a defective portion (e.g., a defective block) of the memory may be identified as bad, such that the defective portion is decommissioned. Accordingly, during the life of the memory, random errors (e.g., a BER level) may increase and physical errors (e.g., a defective rate) may decrease.

A data storage device is initialized to operate in a first mode that allocates the redundancy portion to provide more RAID-type redundancy against physical errors and to provide less ECC-type redundancy against random errors. After an initial period of defect-detection, the device transitions to the second mode that allocates the redundancy portion to provide more ECC-type redundancy against random errors and to provide less RAID-type redundancy against physical errors.

By dynamically changing the distribution of the redundancy portion based on changing modes, the data storage device may have a smaller redundancy allocation of a memory storage capacity as compared to a data storage device that statically allocates a first portion of memory storage capacity to address random errors and that statically allocates a second portion of memory storage capacity to address physical errors. Using less of the memory storage capacity for redundancy data results in increased storage capacity being available for user storage capacity.

DETAILED DESCRIPTION

Particular embodiments of the present disclosure are described with reference to the drawings. In the description, common features are designated by common reference numbers throughout the drawings.

Figure 1:
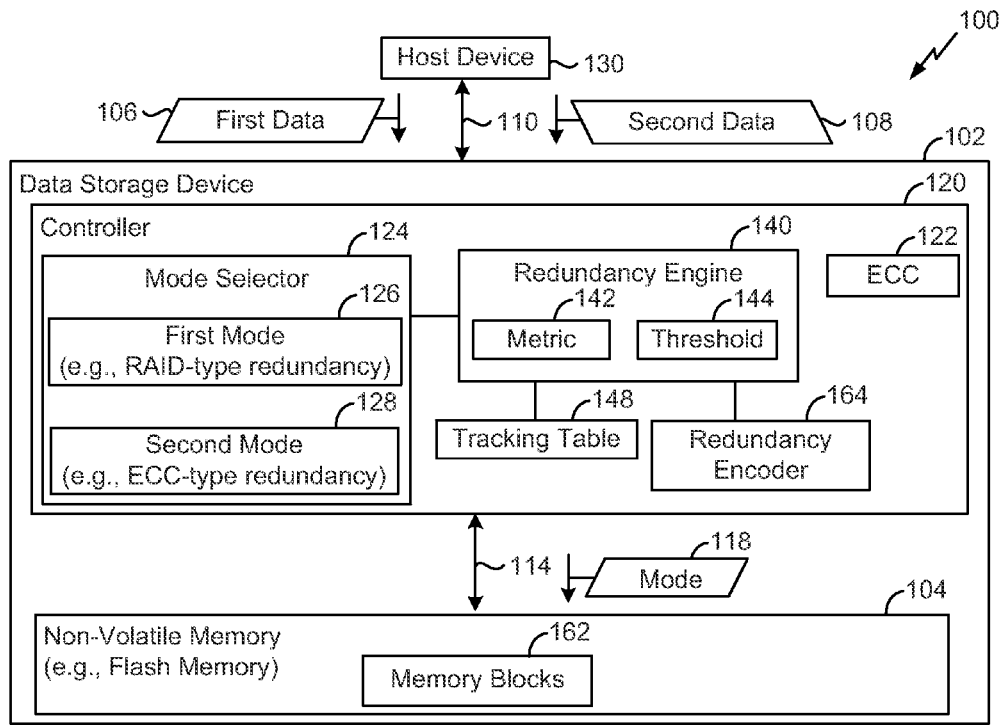
FIG. 1 is a block diagram of a particular illustrative embodiment of a system including a data storage device that stores redundancy data in accordance with a mode.
Figure 1:
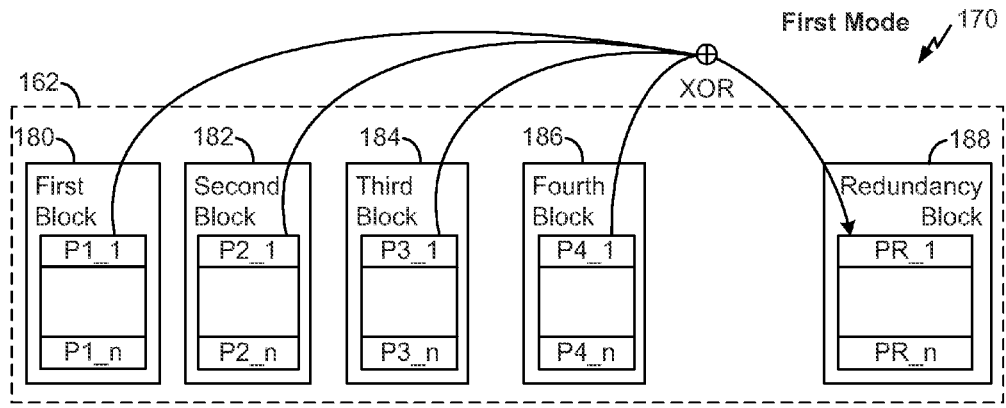
Figure 1:
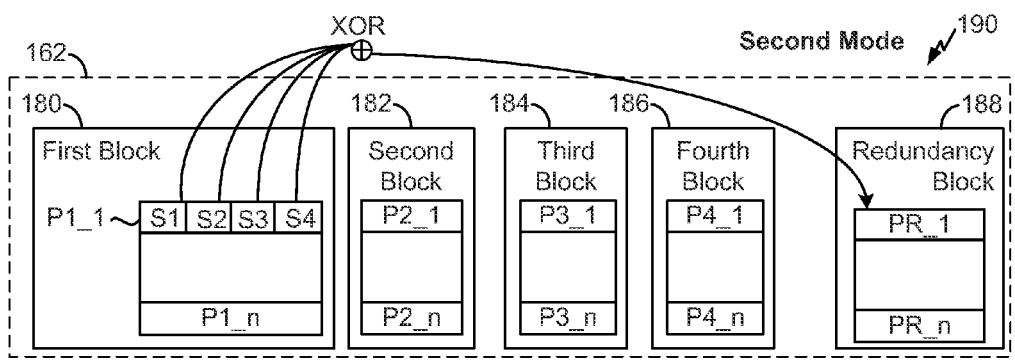

FIG. 1 is a block diagram of a particular illustrative embodiment of a system 100 including a data storage device 102 and a host device 130. The data storage device 102 may store redundancy data in accordance with one or more modes. The data storage device 102 may be coupled to the host device 130 via a communication path 110, such as a wired communication path and/or a wireless communication path. The data storage device 102 may be embedded within the host device 130, such as in accordance with an embedded MultiMedia Card (eMMC®) (trademark of Joint Electron Devices Engineering Council (JEDEC) Solid State Technology Association, Arlington, Va.) configuration. Alternatively, the data storage device 102 may be removable from (i.e., "removably" coupled to) the host device 130. For example, the data storage device 102 may be removably coupled to the host device 130 in accordance with a removable universal serial bus (USB) configuration.

The host device 130 may include a processor and a memory. The memory may be configured to store data and/or instructions that may be executable by the processor. The memory may be a single memory or may include one or more memories, such as one or more non-volatile memories, one or more volatile memories, or a combination thereof. The host device 130 may issue one or more commands to the data storage device 102, such as one or more requests to read data from or write data to a memory of the data storage device 102. For example, the host device 130 may send first data 106 and second data 108 to be written to the memory 104 of the data storage device 102.

The data storage device 102 may include a memory, such as a non-volatile memory 104, coupled to a controller 120. The controller 120 may be coupled to the non-volatile memory 104 via a bus 114, an interface, another structure, or a combination thereof. The non-volatile memory 104 may have a three dimensional (3D) memory configuration. Alternatively, the non-volatile memory 104 may have another memory configuration, such as a two dimensional (2D) memory configuration. The non-volatile memory 104 may store data, such as the first data 106 and the second data 108. The controller 120 may include a redundancy engine 140, a mode selector 124, a tracking table 148, a redundancy encoder 164, and an error correction code (ECC) engine 122.

The controller 120 may receive data and commands (e.g., instructions) from the host device 130 and may send data to the host device 130. The controller 120 may send data and commands to the non-volatile memory 104 and may receive data from the non-volatile memory 104. For example, the controller 120 may send one or more write commands to the non-volatile memory 104 to store the data, such as the first data 106 or the second data 108, to a specified address of the non-volatile memory 104. The write command may specify a physical address of a portion of the non-volatile memory 104 (e.g., a physical address of a word line of the non-volatile memory 104) that is to store the data. The controller 120 is configured to send a read command to the non-volatile memory 104 to access data from a specified address of the non-volatile memory 104. As an example, the controller 120 may send a read command to access the first data 106 stored in the non-volatile memory. The read command may specify the physical address of a portion of the non-volatile memory 104 (e.g., a physical address of the word line storing the first data 106).

The mode selector 124 may be configured to select a mode (e.g., a redundancy mode) according to which redundancy data may be stored into the non-volatile memory 104. A redundancy portion of the non-volatile memory 104 may be allocated, based on the mode, for use between a redundant array of independent disks-type (RAID-type) redundancy data and ECC-type redundancy data. For example, a first amount of the redundancy portion allocated to the RAID-type redundancy data and a second amount of the redundancy portion allocated to the ECC-type redundancy data may be determined based on the mode. To illustrate different allocations of the redundancy portion, a redundancy block of the redundancy portion is described herein as storing the RAID-type redundancy data according to a first allocation of the redundancy portion and storing the ECC-type redundancy data according to the second allocation of the redundancy portion. It is noted that when the redundancy block stores the RAID-type redundancy data according to the first allocation, the redundancy portion of the non-volatile memory 104 other than the redundancy block may store ECC-type redundancy data. Additionally, when the redundancy block stores the ECC-type redundancy data according to the second allocation, the redundancy portion of the non-volatile memory 104 other than the redundancy block may store RAID-type redundancy data.

The mode selector 124 may set an active mode to one of multiple modes, such as a first mode 126 or a second mode 128. The first mode 126 may be associated with storing a redundant array of independent disks-type (RAID-type) redundancy data in a redundancy block of the memory 104 to enable recovery of data in response to a physical error. For example, the RAID-type redundancy data may enable recovery of data from a defective block of the non-volatile memory 104, as described further with reference to FIG. 3. The first mode 126 may be associated with a beginning-of-life of the data storage device 102, such as a beginning-of-life of the non-volatile memory 104 (e.g., a memory system of the data storage device 102). The second mode 128 may be associated with storing ECC-type redundancy data in the redundancy block of the memory 104 to enable recovery of data in response to a random error. For example, the ECC-type redundancy data may enable recovery of individual pages of data having one or more bit errors. The second mode 128 may be associated with operation of the data storage device 102 after the beginning-of-life of the data storage device 102. The mode selector 124 may select the first mode 126 as the active mode prior to selecting the second mode 128 as the active mode. Although the first mode 126 has been described in terms of storing the RAID-type redundancy data and the second mode 128 has been described in terms of storing the ECC-type data, ECC-type redundancy data may also be stored when the active mode is the first mode 126.

The mode selector 124 may be configured to generate a mode indicator 118 indicating the active mode. For example, the mode selector 124 may generate the mode indicator 118 in response to the mode selector 124 changing the active mode from the first mode 126 to the second mode 128. The mode selector 124 may provide the mode indicator 118 to one or more components of the data storage device 102, such as the non-volatile memory 104, the redundancy engine 140, the redundancy encoder 164, the ECC engine 122, or a combination thereof, as illustrative, non-limiting examples. To illustrate, in response to the mode selector 124 changing the active mode from the first mode 126 to the second mode 128, the mode selector 124 may send the mode indicator 118 to the non-volatile memory 104.

The redundancy engine 140 is configured to track one or more metrics 142 associated with operation of the data storage device 102 (e.g., operation of the non-volatile memory 104). The one or more metrics 142 may include a number of cycles (e.g., a number of write/erase (W/E) cycles), a number of defects (e.g., a defect rate based on physical errors, such as a broken wordline (WL), a WL-WL short, etc.), a bit error rate (BER) value, one or more other metrics, or a combination thereof, as illustrative, non-limiting examples.

The redundancy engine 140 may detect one or more conditions based on the one or more metrics 142. For example, the redundancy engine 140 may detect the one or more conditions based on the BER value, based on a defect rate, or a combination thereof, as illustrative, non-limiting examples. As another example, the redundancy engine 140 may compare the one or more metrics 142 to one or more thresholds 144 to detect the one or more conditions. To illustrate, to detect a particular condition, the redundancy engine 140 may compare a particular metric to a corresponding threshold. For example, the redundancy engine 140 may detect a first condition based on a determination that a number of write/erase cycles satisfies (e.g., is greater than or equal to) a threshold number of cycles. As another example, the redundancy engine 140 may detect a second condition based on a determination that a bit error rate (BER) value satisfies (e.g., is greater than or equal to) a threshold BER value. As another example, the redundancy engine 140 may detect a third condition based on a determination that a defect detection rate associated with the non-volatile memory 104 satisfies (e.g., is less than or equal to) a threshold rate. Based on a detection of the one or more conditions, the redundancy engine 140 may provide a signal to the mode selector 124. The signal may be associated with an instruction for the mode selector 124 to change the active mode, such as an instruction to change the active mode from the first mode 126 to the second mode 128. To illustrate, when the active mode is set to the first mode 126 and when the BER value is greater than or equal to the threshold BER value, the redundancy engine 140 may provide the signal to the mode selector 124 to change the active mode from the first mode 126 to the second mode 128.

The tracking table 148 may be configured to track, for each of the blocks of the non-volatile memory 104 that stores redundancy data, a block identifier and a mode indicator to identify the active mode (e.g., the first mode 126 or the second mode 128) used to generate the redundancy data for the block. Additionally, for each block that stores redundancy data, the tracking table 148 may identify one or more other blocks that correspond to the redundancy data stored in the block (e.g., one or more other blocks used to generate the redundancy data).

The redundancy encoder 164 may be configured to generate redundancy data based on the active mode of the data storage device 102. For example, the redundancy engine 164 may receive the mode indicator 118 and may generate the redundancy data based on whether the mode indicator 118 indicates that the active mode is the first mode 126 or the second mode 128. The redundancy encoder 164 may be configurable to perform one or more XOR operations (denoted by the symbol "⊕") based on the active mode, as described further herein. The redundancy data may be provided to the non-volatile memory 104 for storage. For example, when the active mode is the first mode 126, the redundancy encoder 164 may perform one or more XOR operations using pages from different blocks. As another example, when the active mode is the second mode 128, the redundancy encoder 164 may divide a page of a block into multiple sections and perform one or more XOR operations using the multiple sections. In a particular embodiment, the redundancy data generated by the redundancy encoder 164 may be encoded by the ECC engine 122 prior to being provided to the non-volatile memory 104. Although the redundancy encoder 164 is illustrated in the controller 120, in other implementations the redundancy encoder 164 may be included in the non-volatile memory 104. For example, the redundancy encoder 164 may be included in or coupled to read/write circuitry included in the non-volatile memory 104.

The ECC engine 122 is configured to receive data, such as the first data 106 or the second data 108, and to generate one or more error correction code (ECC) codewords (e.g., including a data portion and a parity portion) based on the data. For example, the ECC engine 122 may include an encoder configured to encode the data using an ECC encoding technique. The ECC engine 122 may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof, as illustrative, non-limiting examples.

The ECC engine 122 may include a decoder configured to decode data read from the non-volatile memory 104 to detect and correct bit errors that may be present in the data. For example, the ECC engine 122 may correct a number of bit errors up to an error correction capability of an ECC technique used by the ECC engine 122. A number of errors identified by the ECC engine 122 may be tracked by the controller 120, such as by the ECC engine 122 or by the redundancy engine 140. For example, based on the number of errors, the ECC engine 122 or the redundancy engine 140 may determine a bit error rate (BER) associated with one or more blocks of the non-volatile memory 104.

The non-volatile memory 104, such as a flash memory, may include multiple erase units of memory depicted as a plurality of memory blocks 162. The plurality of memory blocks 162 may be included in a single die or in multiple dies. The plurality of memory blocks 162 may be configured to store redundancy data, user data (e.g., encoded data, such as a codeword including a data portion and a parity portion), or a combination thereof. In a particular embodiment, the redundancy data or the user data may be stored into the plurality of memory blocks 162 according to a wear leveling scheme implemented by the controller 120 and/or the non-volatile memory 104.

The plurality of memory blocks 162 may include a first block 180, a second block 182, a third block 184, a fourth block 186, and a redundancy block 188. One or more of the blocks 180-188 may be on a same die or may be on different dies. For example, each block of the plurality of memory blocks 162 may be on a different die of the non-volatile memory 104. Although the plurality of memory blocks 162 is illustrated as including five blocks, the plurality of memory blocks 162 may include less than five blocks or more than five blocks.

Each block of the plurality of memory blocks 162 may include one or more groups of stored data bits, such as one or more pages. For example, the first block 180 may include a first page (P1_1) and an nth page (P1_n), the second block 182 may include a first page (P2_1) and an nth page (P2_n), the third block 184 may include a first page (P3_1) and an nth page (P3_n), the fourth block 186 may include a first page (P4_1) and an nth page (P4_n), and the redundancy block 188 may include a first page (PR_1) and an nth page (PR_n). Although each block of the plurality of memory blocks 162 is illustrated as having the same number of pages, one or more of the blocks 180-188 may have a different number of pages than another of the blocks 180-188. Additionally, although each block of the plurality of memory blocks 162 is illustrated as including two pages, each block may include more than two pages or less than two pages.

Multiple blocks, such as the first block 180, the second block 182, the third block 184, and the fourth block 186, may be configured to store user data, such as the first data 106 or the second data 108. For example, the multiple blocks 180-186 may be configured to store encoded user data which has been encoded by the ECC engine 122. To illustrate, the first page (P1_1) of the first block 180 may store a first codeword, the first page (P2_1) of the second block 182 may store a second codeword, the first page (P3_1) of the third block 184 may store a third codeword, and the first page (P4_1) of the fourth block 186 may store a fourth codeword.

An illustrative example of generating first redundancy data based on the first mode 126 is illustrated and generally designated 170. The first redundancy data may be associated with inter-block redundancy in which multiple pages from different blocks are XORed together to generate the first redundancy data, as described further herein. The first redundancy data may be used to recover from a physical error, as described with reference to FIG. 3.

The redundancy block 188 may be configured to store redundancy data, such as the first redundancy data generated by the redundancy encoder 164 based on the first mode 126. For example, when the redundancy encoder 164 operates according to the first mode 126, the redundancy encoder 164 may generate the first redundancy data that is stored into a page of the redundancy block 188, such as the first page (PR_1) of the redundancy block 188. Based on the first mode 126, the redundancy encoder 164 may generate the first redundancy data by XORing multiple pages from different blocks together. For example, a group of pages may be XORed together to generate the first redundancy data (e.g., a first redundant page) that is stored into the redundancy block 188. To illustrate, a first group of pages including the first page (P1_1) of the first block 180, the first page (P2_1) of the second block 182, the first page (P3_1) of the third block 184, and the first page (P4_1) of the fourth block 186 may be XORed together to generate a page of the first redundancy data that is stored into the first page (PR_1) of the redundancy block 188.

When the redundancy data is generated and stored according to the first mode 126, each page of the redundancy block 188 may store corresponding redundancy data associated with a different group of pages of the multiple blocks 180-186. For example, each page of the redundancy block 188 may be associated with a different "horizontal" group of pages of the multiple blocks 180-186, may be associated with a different "diagonal" group of pages of the multiple blocks 180-186, or may be associated with another group of pages of the multiple blocks 180-186, as described further with reference to FIG. 2. Although the plurality of memory blocks 162 is illustrated as only including one redundancy block (e.g., the redundancy block 188) for the multiple blocks 180-186, the plurality of memory blocks 162 may include more than one redundancy block associated with the multiple memory blocks 180-186. For example, multiple redundancy blocks may be used to store redundancy data associated with one or more blocks, such as the multiple memory blocks 180-186, as described further with reference to FIG. 2.

An illustrative example of generating second redundancy data based on the second mode 128 is illustrated and generally designated 190. The second redundancy data may be associated with intra-block redundancy in which each page of the redundancy block 188 may be configured to store redundancy data corresponding to a different block of the multiple blocks 180-186.

In the second mode, the redundancy block 188 is configured to store the second redundancy data generated by the redundancy encoder 164 based on the second mode 128. For example, when the redundancy encoder 164 operates according to the second mode 128, the redundancy encoder 164 may generate the second redundancy data that is stored into the page of the redundancy block 188, such as the first page (PR_1) of the redundancy block 188. Based on the second mode 128, the second redundancy data generated may be associated with storing ECC-type redundancy data to enable recovery of data in response to a random error. Based on the second mode 128, the redundancy encoder 164 may logically divide a particular page (e.g., data stored in the particular page) of a particular block into multiple sections, such as multiple data chunks, and may generate the second redundancy data by XORing the multiple sections of the page together. For example, the first page (P1_1) of the first block 180 may be divided into multiple sections S1-S4. The multiple sections S1-S4 may be XORed together to generate the second redundancy data (e.g., at least a portion of a second redundant page) that is stored into the redundancy block 188. To illustrate, a first section S1, a second section S2, a third section S3, and a fourth section S4 may be XORed together to generate at least a portion of a page of the second redundancy data that is stored into the first page (PR_1) of the redundancy block 188. Thus, when a random error is detected during a read operation of the first page (P1_1) of the first block 180, the first page (PR_1) of the redundancy block 188 may be used to recover the first page (P1_1), as described with reference to FIG. 3.

Although the first page (P1_1) of the first block 180 is illustrated in FIG. 1 as being divided into four sections, the first page (P1_1) may be divided into more than four sections or less than four sections. In a particular embodiment, the first page (P1_1) of the redundancy block 188 is divided into a number of sections that is based on a number of pages included in the redundancy block 188. For example, when the first block 180 includes 32 pages, the first page (P1_1) of the first block 180 may be divided into 32 sections. Although described as sections of a single page, each section S1-S4 could instead be an individual ECC codeword in a single word line of the first memory block 180.

During operation of the data storage device 102, the mode selector 124 may select the active redundancy mode (to be used during operation of the data storage device 102) to be the first mode 126. The first mode 126 may be associated with or correspond to a beginning-of-life of the data storage device 102, such as a beginning-of-life of a memory system (including the non-volatile memory 104) of the data storage device 102.

When the active redundancy mode of the data storage device 102 is the first mode 126, the data storage device 102 may receive the first data 106 to be stored into the non-volatile memory 104. The ECC engine 122 may encode the first data 106 to generate encoded first data and the encoded first data may be provided to the non-volatile memory 104 for storage. For example, the first data 106 (or the encoded first data) may be stored into one or more of the multiple blocks 180-186.

Based on the active mode being the first mode 126 (e.g., the RAID-type redundancy), the redundancy encoder 164 may generate the first redundancy data based on the first data 106. For example, the redundancy encoder 164 may XOR together multiple pages of the multiple blocks 180-186 to generate the first redundancy data. The first redundancy data may be stored into a page of the redundancy block 188, such as the first page (PR_1) of the redundancy block 188. In a particular embodiment, the first redundancy data may be encoded by the ECC engine 122 prior to be being stored at the non-volatile memory 104.

The redundancy engine 140 may monitor one or more conditions based on the operation of the data storage device 102. Based on the redundancy engine 140 detecting a particular condition of the one or more conditions (e.g., by comparing the one or more metrics 142 to the one or more thresholds 144), the redundancy engine 140 may send a signal to the mode selector 124 to instruct the mode selector 124 to transition the active mode from the first mode 126 (e.g., the RAID-type redundancy) to the second mode 128 (e.g. the ECC-type redundancy). The mode selector 124 may set the active mode to the second mode 128 and may send a mode indicator 118 to one or more components of the data storage device 102 indicating that the second mode 128 is the active mode.

The data storage device 102 may receive the second data 108 to be stored into the non-volatile memory 104. The ECC engine 122 may encode the second data 108 to generate encoded second data and the encoded second data may be provided to the non-volatile memory 104 for storage. For example, the second data 108 (or the encoded second data) may be stored into one or more of the multiple blocks 180-186.

Based on the active mode being the second mode 128 (e.g., the ECC-type redundancy), the redundancy encoder 164 may generate the second redundancy data based on the second data 108. For example, the redundancy encoder 164 may divide a page of a block of the multiple blocks 180-186, such as the first page (P1_1) of the first block 180, into multiple sections and may XOR together the multiple sections (e.g., the multiple sections S1-S4) to generate the second redundancy data. The second redundancy data may be stored into the page of the redundancy block 188, such as the first page (PR_1) of the redundancy block 188. In a particular embodiment, the second redundancy data may be encoded by the ECC engine 122 prior to be being stored at the non-volatile memory 104. In the event of a detected error by the data storage device 102, the data storage device 102 may use the redundancy data (e.g., the first redundancy data or the second redundancy data) to correct the error and/or to generate corrected data, as described herein with reference to FIG. 3.

As illustrated with respect to FIG. 1, in the second mode 128 the second redundancy data may be formed by XORing bits from a page of data, and the second redundancy data may be stored in the redundancy block 188. The page of data may include an ECC codeword (such as an LDPC codeword, with a data portion and a parity portion) and the second redundancy bits may be used by the ECC engine 122 as additional parity bits during decoding of the ECC codeword to improve a decoding capability of the ECC engine 122. In this manner, hardware components (e.g., XOR circuits) used to generate the first redundancy data in the first mode 126 may also be used to generate the second redundancy data in the second mode 128 to improve an ECC correction capability for individual codewords.

In other implementations, however, the second redundancy data may instead be generated by the ECC engine 122 as ECC parity bits to provide increased error correction capability as compared to generating the second redundancy data using the XOR circuitry described above. For example, in the first mode 126, user data may be encoded by the ECC engine 122 to generate a set of parity bits, such as according to an LDPC encoding, to form an ECC codeword. The size of the ECC codeword may exceed a page size in the first mode 126 (e.g., a size of the ECC codeword may exceed a size of the first page P1_1), and some of the ECC parity bits may be discarded during storage at the non-volatile memory 104 rather than having the ECC codeword extend across multiple pages. Because relatively few bit errors occur early in the life of the non-volatile memory 104 as compared to near an end-of-life of the non-volatile memory 104, a reduced set of ECC parity bits may provide sufficient error correction capability for data recovery while the non-volatile memory 104 is "fresh." In the second mode 128, when the redundancy block 188 is no longer dedicated to storing RAID-type redundancy data, the additional capacity of the redundancy block 188 may be used to enable storing of the full set of ECC parity bits that are generated for each codeword. For example, in some implementations the redundancy block 188 provides, in the second mode 128, dedicated storage for the ECC parity bits that would have been discarded in the first mode 126, so that an ECC codeword may be retrieved by reading a first portion of the ECC codeword from one of the blocks 180-186 and reading a second portion (the additional parity bits) from the redundancy block 188. In other implementations, the redundancy block 188 is used by the controller 120 as an extension of the memory capacity provided by the blocks 180-186 rather than as dedicated storage for parity bits. For example, in the second mode 128 the redundancy block 188 may store a same number of full ECC codewords as each of the other blocks 180-186.

Although the implementations described above use a single ECC encoding scheme (e.g., LDPC) that discards parity bits in the first mode 126 and that does not discard parity bits in the second mode 128, in other implementations different ECC encoding schemes may be used in the first mode 126 as compared to the second mode 128. For example, in the first mode 126 a first ECC coding scheme may encode first user data to generate a first set of parity bits and in the second mode 128 a second ECC coding scheme may encode the first user data to generate a second set of parity bits that has a greater number of bits than the first set of parity bits.

In some implementations, when the data storage device 102 operates according to the second mode 128, an amount of redundancy data associated with the redundancy block 188 may be distributed among the blocks 180-186 and the redundancy block 188. For example, the amount of redundancy data associated with the redundancy block 188 may correspond to a size (e.g., a number of bits) of the redundancy block 188. Distributing the amount of redundancy data associated with the redundancy block 188 may provide additional ECC-type redundancy as described further herein. To illustrate, in the first mode 126, each of the blocks 180-186 may be configured to store first encoded data, such as first codewords generated by the ECC engine 122 (based on a first ECC code). The first codewords generated by the ECC engine 122 may be provided to the first blocks 180-186 via the redundancy encoder 164. Each of the first codewords may have a first size (e.g., a first number of bits) and may include a first data portion and a first parity portion.

In the second mode 128, each of the blocks 180-186 and the redundancy block 188 may be configured to store second encoded data, such as second codewords generated by the ECC engine 122 (e.g., based on a second ECC code that is different than the first ECC code). For example, user data stored in the first mode 126 in the blocks 180-186 may, in the second mode 128, be distributed across a greater number of codewords, such codewords stored in the blocks 180-186 and the redundancy block 188, with each codeword having fewer data bits and more parity bits as compared to codewords in the first mode 126. To illustrate, the second codewords generated by the ECC engine 122 may be provided to the first blocks 180-186 and to the redundancy block 188 via the redundancy encoder 164. Each of the second codewords may have the first size (e.g., the first number of bits) and may include a second data portion and a second parity portion. The second parity portion may have more parity bits than the first parity portion.

Accordingly, the second data portion may have fewer data bits than the first data portion. The additional parity bits included in each of the second codewords may be a result of the amount of redundancy data associated with the redundancy block 188 being distributed among the blocks 180-186 and the redundancy block 188. The second codewords may be associated with (e.g., computed based on) the second ECC code, such as a low-density parity check (LDPC) code. By distributing the amount of redundancy data associated with the redundancy block 188 among the blocks 180-186 and the redundancy block 188, each of the second codewords may have more parity bits as compared to each of the first codewords. Thus, in the second mode 128, each of the second codewords provides an increased amount of ECC-type redundancy (e.g., an increased number of parity bits) against random errors as compared to the first codewords used in the first mode 126.

In other implementations, when the data storage device 102 operates according to the second mode 128, a first portion of the codeword may be stored at one of the blocks 180-186 and a second portion of a codeword may be stored at redundancy block 188. To illustrate, in the first mode 126, each of the blocks 180-186 may be configured to store first encoded data, such as first codewords generated by the ECC engine 122 (based on a first ECC code). The first codewords generated by the ECC engine 122 may be provided to the first blocks 180-186 via the redundancy encoder 164. Each of the first codewords may have a first size (e.g., a first number of bits) and may include a first data portion and a first parity portion.

In the second mode 128, the ECC engine 122 may generate second codewords having a second size (e.g., a second number of bits) that is larger than the first size. For example, each of the second codewords may be generated based on a second ECC code, such as an LDPC code, that is different than the first ECC code. Each of the second codewords may include a second data portion and a second parity portion. The second data portion may have the same number of bits, more bits, or fewer bits as compared to the first data portion. The second parity portion may have more parity bits than the first parity portion. By having more parity bits than the first parity portion, each of the second codewords may be associated with an increased amount of ECC-type redundancy as compared to each of the first codewords. For example, the additional parity bits of the second codewords may enable more correction capability (for random errors) by a decoder (e.g., a low-density parity check (LDPC) decoder).

The second size of each of the second codewords may be larger than a page size of the pages of the blocks 180-186. Accordingly, when operating in the second mode 128, a first portion of a second codeword may be stored at a page of one of the blocks 180-186 and a second portion (e.g., an overflow portion) of the second codeword may be stored at a page of the redundancy block 188. For example, each page of the first block 180 may store a first portion of a corresponding second codeword. Each second portion of the second codewords stored at the first block 180 may be stored at the first page (PR_1) of the redundancy block 188. To illustrate, the redundancy engine 164 may parse the second codewords into first portions and second portions and may send the second portions to the redundancy block 188 as redundancy data. For example, the first page (PR_1) may be configured to store the second portions of the second codewords (associated with the first block 180) and the second page (PR_2) of the redundancy block 188 may store the second portions of the second codewords (associated with the second block 182). Accordingly, the second portions stored at the redundancy block 188 may be associated with (e.g., computed based on) the second ECC code, such as a low-density parity check (LDPC) code. By configuring the redundancy block 188 in the second mode 128 to store second portions of the second codewords, the second mode 128 may have an increased amount of ECC-type redundancy (e.g., an amount of parity bits) against random errors as compared to the first mode 126 that uses the first codewords.

Although illustrated as separate components, the mode selector 124, the redundancy engine 140, the redundancy encoder 164, or a combination thereof may be included in a single component of the controller 120. Additionally, the mode selector 124, the redundancy engine 140, the redundancy encoder 164, or a combination thereof may be embodied in firmware that is executable by a processor included in the controller 120. The firmware may be stored in a memory included in the controller 120, in the non-volatile memory 104, or in a memory coupled to the controller 120. In another particular embodiment, one or more of the mode selector 124, the redundancy engine 140, the redundancy encoder 164, or a combination thereof may be included in the non-volatile memory 104.

Although the one or more metrics 142, the one or more thresholds 144, and the tracking table 148, are illustrated as stored in a memory included in the controller 120, in other implementations one or more of the metrics 142, the thresholds 144, or the tracking table 148 may be stored in the non-volatile memory 104 or in a memory coupled to the controller 120. A memory included in the controller 120 may include a single memory component or may correspond to multiple distinct memory components and/or multiple different types of memory components. For example, all or part of the memory included in the controller 120 may correspond to a random access memory (RAM) or a high-speed cache. All or part of the memory included in the controller 120 may correspond to another type of memory, such as a non-volatile memory included in the controller 120.

Although not illustrated in FIG. 1, the non-volatile memory 104 includes read/write circuitry configured to read data from or write data to one or more of the plurality of memory blocks 162. The read/write circuitry may be configurable to operate in accordance with the first mode 126 or the second mode 128. In some implementations, the read/write circuitry may include the redundancy encoder 164.

Although FIG. 1 illustrates a single redundancy block 188 that changes configuration based on the redundancy mode, the plurality of memory blocks 162 may include multiple redundancy blocks. One or more redundancy blocks may be dedicated to a particular type of redundancy independent of the redundancy mode (e.g., the first mode or the second mode). For example, one redundancy block may remain a RAID-type redundancy block while another redundancy block 188 changes from RAID-type to ECC-type based on the redundancy mode.

By tracking (e.g., monitoring) one or more conditions associated with the data storage device 102, the controller 120 may dynamically change the active mode from the first mode 126 to the second mode 128 over a life of the data storage device 102. Accordingly, as the data storage device 102 ages and a frequency of random errors increases, the controller 120 may shift from the first mode 126 (e.g., the RAID-type redundancy) associated with inter-block redundancy data to the second mode 128 (e.g., the ECC-type redundancy) associated with intra-block redundancy data.

Figure 2:
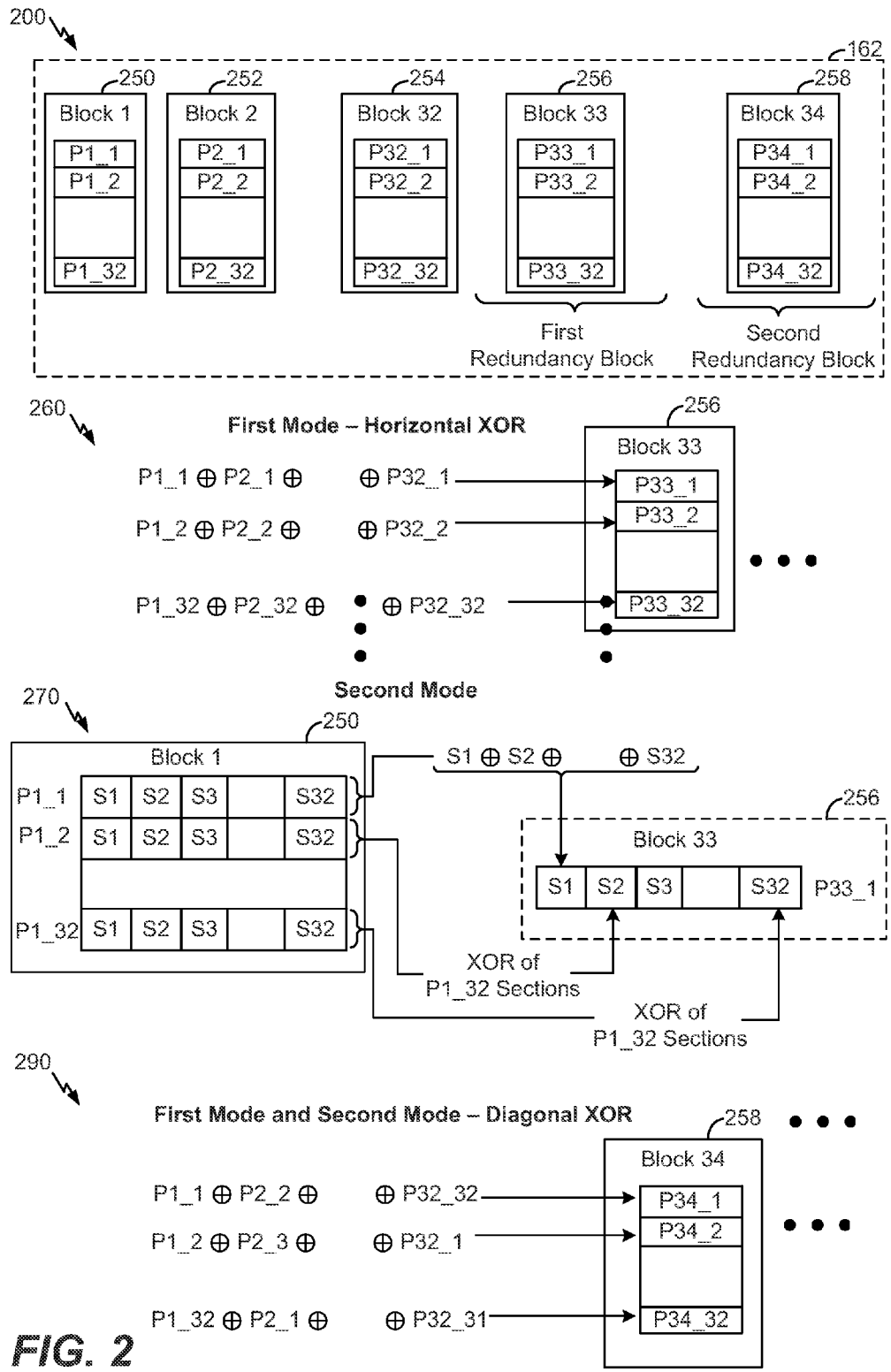
FIG. 2 is a diagram illustrating a plurality of memory blocks and illustrating operations to generate redundancy data according to a first mode and according to a second mode.

Referring to FIG. 2, a particular illustrative embodiment of the plurality of memory blocks 162 is depicted and designated 200. The plurality of memory blocks 162 may be included in the non-volatile memory 104 of the data storage device 102. One or more blocks of the plurality of memory blocks 162 may be configured to store redundancy data generated in accordance with the first mode 126 or in accordance with the second mode 128 of FIG. 1, as further described herein.

The plurality of memory blocks 162 may include 34 blocks, including a first block 250, a second block 252, a third through a thirty-first block (not shown), a thirty-second block 254, a thirty-third block 256, and a thirty-fourth block 258. It is noted that blocks three through thirty-one have not been illustrated in FIG. 2 for simplicity of the illustration. The plurality of memory blocks 162 may be configured to store user data, redundancy data, or a combination thereof. In a particular embodiment, the user data or the redundancy data may be encoded by an ECC engine, such as the ECC engine 122 of FIG. 1. Multiple blocks (e.g., blocks 250-254) may be used to store user data (or encoded user data). The thirty-third block 256 and the thirty-fourth block 258 may be configured to store redundancy data (or encoded redundancy data). To illustrate, the thirty-third block 256 may be a first redundancy block and the thirty-fourth block 258 may be a second redundancy block. The thirty-third block 256 or the thirty-fourth block 258 may include or correspond to the redundancy block 188 of FIG. 1. At least one of the first redundancy block (e.g., the thirty-third block 256) or the second redundancy block (e.g., the thirty-fourth block 258) may store redundancy data based on an active mode of the data storage device 102, as described further herein. For example, the first redundancy block (e.g., the thirty-third block 256) may store redundancy data based on the active mode (e.g., the first mode 126 or the second mode 128) and the second redundancy block (e.g., the thirty-fourth block 258) may store redundancy data that is not based on the active mode. Although the plurality of memory blocks 162, as illustrated in FIG. 2, includes 34 blocks, the plurality of memory blocks 162 may include less than or more than 34 blocks.

Each block of the plurality of memory blocks 162 may include one or more pages. For example, each block of the plurality of memory blocks 162 may include 32 pages. As illustrated, the first block 250 may include a first page (P1_1), a second page (P1_2), and a thirty-second page (P1_32). Although each block of the plurality of memory blocks 162 is illustrated as having the same number of pages, one or more of the blocks 250-258 may have a different number of pages. Additionally, although each block of the plurality of memory blocks 162 is described as including thirty-two pages, each block may include more than thirty-two pages or less than thirty-two pages. In a particular embodiment, a number of pages included in each block of the plurality of memory blocks 162 corresponds to a number of blocks included in the multiple blocks 250-254 that store user data (or encoded user data).

An illustrative example of first redundancy data stored into the first redundancy block (e.g., the thirty-third block 256) based on the first mode 126 is illustrated and designated 260. The first redundancy data may be associated with inter-block redundancy in which multiple pages from different blocks are XORed together to generate the first redundancy data. For example, multiple pages of multiple blocks (e.g., the first block 250 through the thirty-second block 254) may be included in a first group, such as a "horizontal" group of pages having a same page position (e.g., a top page position, a second from the top position, a bottom portion, etc.) across the multiple blocks 250-254. To illustrate, the first group may include a first page of each block of the multiple blocks that are XORed together to generate a redundancy page that is stored into a first page of the first redundancy block, such as a first page (P33_1) of the thirty-third block 256. A second page (P33_2) of the thirty-third block 256 may store another page of data based on XORing a second page of each block of the first block 250 through the thirty-second block 254.

An illustrative example of second redundancy data stored into the thirty-third block 256 (e.g., the first redundancy block) based on the second mode 128 is illustrated and generally designated 270. The second redundancy data may be associated with intra-block redundancy in which each page of the first redundancy block may be configured to store redundancy data corresponding to a different block of the multiple blocks 250-254. To illustrate, each page of the first redundancy block may correspond to a single block of the multiple blocks 250-254. For example, the first block 250 may correspond to the first page (P33_1) of the thirty-third block 256 (e.g., the first redundancy block). As another example, the second block 252 may correspond to the second page (P33_2) of the thirty-third block 256.

Each page of the plurality of pages of the first block 250 may be divided into a plurality of sections, such as a first section (S1) through a thirty-second section (S32). For each page of the first block 250, the plurality of sections may be XORed together to generate a corresponding portion of the second redundancy data. For example, each section of the plurality of sections of the first page (P1_1) of the first block 250 may be XORed together to generate a first portion of the second redundancy data. As another example, each section of the plurality of sections of the second page (P1_2) of the first block 250 may be XORed together to generate a second portion of the second redundancy data. Although each page of the first block 250 is described as including thirty-two sections, each page may include more than thirty-two sections or less than thirty-two sections.

Pages of the first redundancy block (e.g., the thirty-third block 256) may be divided into a plurality of sections, such as a first section (S1) through a thirty-second section (S32). Each section of the plurality of sections of the thirty-third block 256 may correspond to a different page of the first block 250 and may be configured to store a portion of the second redundancy data. For example, the first section (S1) of the thirty-third block 256 may correspond to the first page (P1_1) of the first block 250 and may be configured to store the first potion of the second redundancy data. As another example, the second section (S2) of the thirty-third block 256 may correspond to the second page (P1_2) of the first block 250 and may be configured to store the second potion of the second redundancy data.

The plurality of sections of the first page (P33_1) of the thirty-third block 256 may include an entirety of the first page (P33_1) of the thirty-third block 256 or may include less than the entirety of the first page (P33_1) of the thirty-third block 256. For example, a size of the plurality of sections of the first page (P33_1) of the thirty-third block 256 may be based on a size of a data portion of a codeword generated by the ECC engine 122 of FIG. 1. Although the plurality of sections of each page of the first block 250 includes a same number of sections as the plurality of sections of the first page (P33_1) of the thirty-third block 256 as illustrated in FIG. 2, a number of sections in the first page (P33_1) of the thirty-third block 256 may be the same as, or may be different than, a number of sections in each page of the first block 250. For example, a number of sections in each page of the first block 250 may be determined such that a XOR result of each section of a page of the first block 250 may be stored into a corresponding section of the first page (P33_1) of the thirty-third block 256.

An illustrative example of third redundancy data stored into the second redundancy block (e.g., the thirty-fourth block 258) is illustrated and generally designated 290. The third redundancy data may be stored into the second redundancy block (e.g., the thirty-fourth block 258) regardless of the active mode. The third redundancy data may be associated with inter-block redundancy in which multiple pages from different blocks are XORed together to generate the third redundancy data. For example, multiple pages of multiple blocks 250-254 may be included in a second group, such as a "diagonal" group of pages (e.g., each page of the group having a different page position) across the multiple blocks 250-254. To illustrate, the second group may include a page of each block of the multiple blocks 250-254 that are XORed together to generate a redundancy page that is stored into a first page of the second redundancy block, such as a first page (P34_1) of the thirty-fourth block 258. A second page (P34_2) of the thirty-fourth block 258 may store a page of redundancy data generated by XORing another page of each block of the first block 250 through the thirty-second block 254 in a "diagonal stripe" type configuration. Each page of a "diagonal" group that is XORed together may include a codeword generated based on an error correcting code (ECC) code, such as a low-density parity check (LDPC) code. Accordingly, the third redundancy data may be associated with (e.g., computed based on) the ECC code.

In a particular embodiment, the data storage device 102, operating according to the first mode 126, includes the first redundancy block (e.g., the thirty-third block 256) and the second redundancy block (e.g., the thirty-fourth block 258) that each stores inter-block redundancy associated with recovering data based on physical errors. The first redundancy block may store the first redundancy data that includes a first XOR result generated based on a first group of multiple pages being XORed together. The first group of multiple pages may include a horizontal group of pages across the multiple blocks 250-254, a diagonal group of pages across the multiple blocks 250-254, or another grouping of pages across the multiple blocks 250-254. The second redundancy block may store the third redundancy data that includes a second XOR result generated based on a second group of multiple pages being XORed together. The second group of multiple pages may include a horizontal group of pages across the multiple blocks 250-254, a diagonal group of pages across the multiple blocks 250-254, or another grouping of pages across the multiple blocks 250-254. Each page of the multiple blocks 250-254 may be included in two XOR groups. When each page is included in two XOR groups that are used to generate inter-block redundancy data (e.g., RAID-type redundancy), the data storage device 102 may be referred to as using two-dimensional XOR redundancy, such as 2XOR inter-block redundancy.

In some implementations, one or more redundancy blocks 256, 258 may be dedicated to a particular type of redundancy independent of the redundancy mode (e.g., the first mode or the second mode). For example, the second redundancy block (e.g., the thirty-fourth block 258) may remain a RAID-type redundancy block while the first redundancy block (e.g., the thirty-third block 256) changes from RAID-type to ECC-type based on the redundancy mode.

In other implementations, when the data storage device 102 operates according to the second mode 128, the second redundancy block (e.g., the thirty-fourth block 258) may remain a RAID-type redundancy block while an amount of redundancy data associated with the first redundancy block (e.g., the thirty-third block 256) is distributed among at least the first block 250 through the thirty-third block 256. To illustrate, in the first mode each page of the first block 250 through the thirty-third block 256 is configured to store first codewords (generated by the ECC engine 122) having a first amount of parity data. In the second mode, rather than the first redundancy block (e.g., the thirty-third block 256) storing additional redundancy data for each of the first block 250 through the thirty-third block 256, at least a portion of the additional redundancy data is stored in each of the first block 250 through the thirty-third block 256. For example, each page of the first block 250 through the thirty-third block 256 is configured to store second codewords (generated by the ECC engine 122) having a second amount of parity data that is greater than the first amount of parity data. Additionally, the first redundancy block (e.g., the thirty-third block 256) may also be configured to store the second codewords having the second amount of parity data.

By reconfiguring use of the first redundancy block (e.g., the thirty-third block 256) based on the active mode (e.g., the first mode 126 or the second mode 128), the data storage device 102 may increase an amount of ECC-type redundancy during the life of the data storage device 102 after an initial period has ended. The increase in the amount of ECC-type redundancy may enable the data storage device 102 to better recover from random errors that may increase in number over the life of the data storage device 102. The increase in the amount of ECC-type redundancy may correspond to a decrease in the amount of RAID-type redundancy used to recover from physical errors, which may decrease over the life of the data storage device 102.

Figure 3:
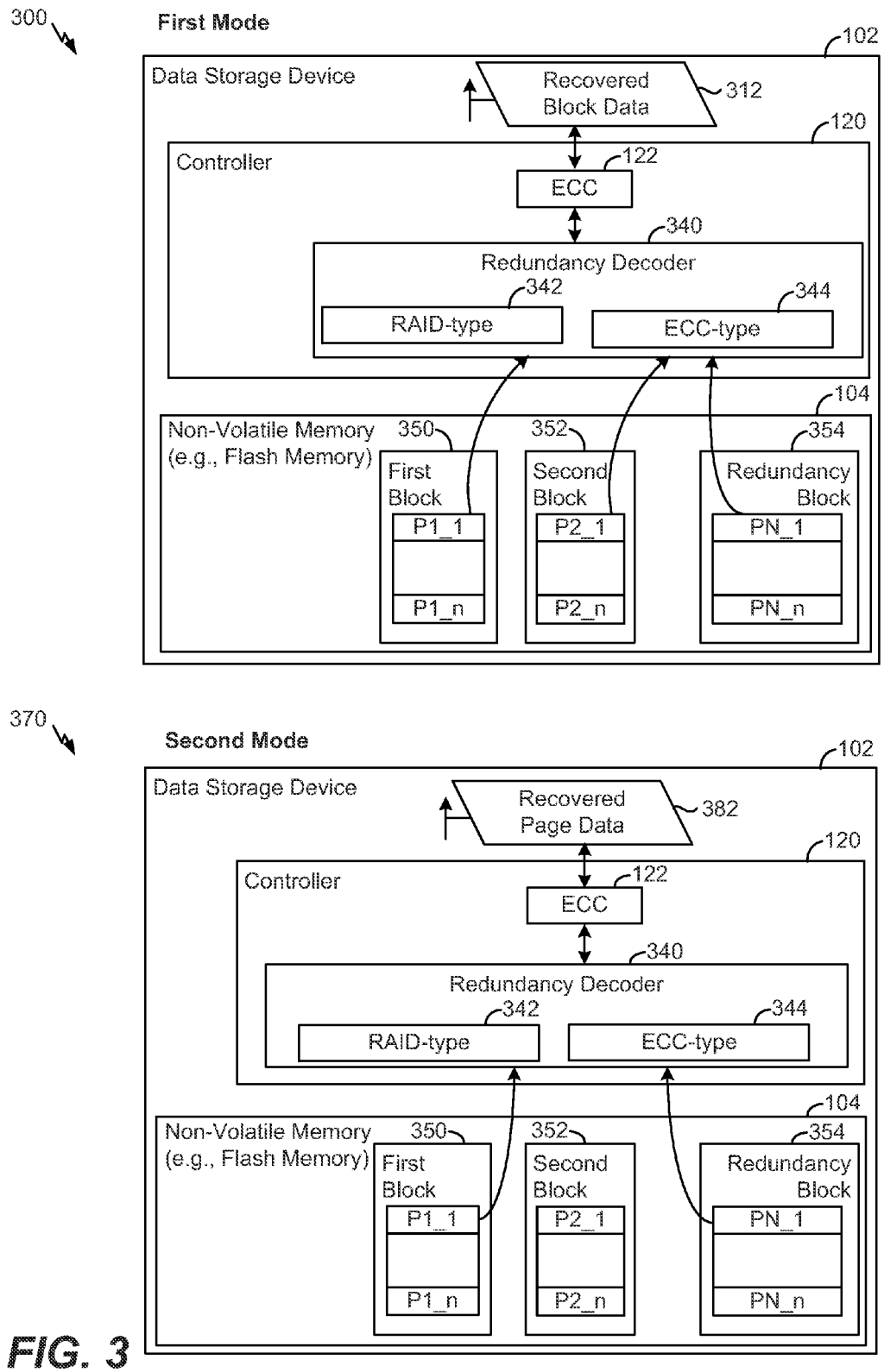
FIG. 3 illustrates a first embodiment of data recovery based on first redundancy data associated with a first mode and a second embodiment of data recovery based on second redundancy data associated with a second mode.

Referring to FIG. 3, particular illustrative embodiments of data recovery performed by the data storage device 102 is depicted. For example, a first illustrative example of data recovery based on first redundancy data associated with the first mode 126 is depicted and designated 300. As another example, a second illustrative example of data recovery based on second redundancy data associated with the second mode 128 is depicted and designated 370.

Referring to the first illustrative example designated 300, the data storage device 102 includes the controller 120 and the non-volatile memory 104. The controller 120 includes the ECC engine 122 and a redundancy decoder 340. The redundancy decoder 340 may be configured to decode redundancy data retrieved from the non-volatile memory 104 or to recover data suffering from an error, such as a physical error or a random error, as described further herein. The redundancy decoder 340 is configured to decode the redundancy data based on the active mode used when the redundancy data was generated and/or stored. For example, the redundancy decoder 340 may determine which mode was the active mode (e.g., the first mode 126 or the second mode 128) when the redundancy data was generated based on the tracking table 148. The redundancy decoder 340 may include a RAID-type decoder 342 and an ECC-type decoder 344. The RAID-type decoder 342 may be configured to decode first redundancy data stored according to the first mode 126 and to recover data suffering from a physical error. The ECC-type decoder 344 may be configured to decode second redundancy data stored according to the second mode 128 and to recover data suffering from a random error. Although the redundancy decoder 340 is illustrated as being included in the controller 120, the redundancy decoder 340 may be included in the non-volatile memory 104. For example, the redundancy decoder 340 may be included in or coupled to read/write circuitry included in the non-volatile memory 104.

In a particular embodiment, the redundancy decoder 340 may be combined with the mode selector 124, the redundancy engine 140, the redundancy encoder 164, or read/write circuitry included in the non-volatile memory 104. The redundancy decoder 340 may be embodied in firmware that is executable by a processor included in the controller 120. The firmware may be stored in another memory included in the controller 120, in the non-volatile memory 104, or in a memory coupled to the controller 120.

The non-volatile memory 104, such as a flash memory, may include a plurality of memory blocks, such as a first block 350, a second block 352, and a redundancy block 354. The first block 350, the second block 352, and the redundancy block 354 may be included in the plurality of memory blocks 162 of FIG. 1. The redundancy block 354 may include or correspond to the redundancy block 188 of FIG. 1, the thirty-third block 256, or the thirty-fourth block 258 of FIG. 2. One or more of the blocks 350-354 may be on a same die or may be on different dies of the non-volatile memory 104. Although the non-volatile memory 104 is illustrated as including three blocks, the non-volatile memory 104 may include less than three blocks or more than three blocks.

During operation of the data storage device 102, as illustrated by the first illustrative example designated 300, the controller 120 may determine that a physical error occurred at the first block 350 in association with a read operation performed on the first block 350. The redundancy decoder 340 may determine what mode, such as the first mode 126 or the second mode 128, was the active mode when data was stored into the first block 350. For example, the redundancy decoder 340 may access the tracking table 148 and may determine that the first mode 126 was the active mode when the data was stored into the first block 350. To recover the data of the first block 350, the redundancy decoder 340 may receive redundancy data (e.g., inter-block redundancy data) stored at the redundancy block 354 and data from each block (other than the first block 350) that was used to generate the redundancy data stored in the redundancy block 354. The redundancy data from the redundancy block 354 and the data from the blocks other than the first block 350, such as data from the second block 352, may be provided to the RAID-type decoder 342 to recover the data from the first block 350.

The RAID-type decoder 342 may recover the data from the first block 350 by performing a XOR operation using the redundancy data from the redundancy block 354 and the data from the blocks other than the first block 350. For example, the RAID-type decoder 342 may generate a XOR result that is associated with the data that was stored at the first block 350, such as one or more codewords stored in the pages of the first block 350. After the RAID-type decoder 342 has generated the XOR result, the redundancy decoder 340 may provide the XOR result to the ECC engine 122. The ECC engine 122 may process the XOR result as though the XOR result is read data from the first block 350. For example, the ECC engine 122 may decode the XOR result to detect and correct one or more bit errors that may be present in the XOR result. After the ECC engine 122 has corrected the one or bit errors, the ECC engine 122 may output recovered block data 312 associated with the data from the first block 350. The ECC engine 122 may correct the one or more bit errors present in the XOR result and encode (e.g., re-encode) the corrected data to generate the recovered block data 312. The recovered block data 312 may be stored into a block of the non-volatile memory 104, such as a block that is not a redundancy block, and the tracking table 148 may be updated to reflect the location of the recovered block data 312 (e.g., data formerly stored at the first block 350).

Although the first illustrative example designated 300 has been described in terms of the redundancy data from the redundancy block 354 and the data from the blocks other than the first block 350 being provided to the redundancy decoder 340, the redundancy data from the redundancy block 354 or the data from the blocks other than the first block 350 may be provided to the ECC engine 122 prior to being provided to the redundancy decoder 340. For example, the ECC engine 122 may detect and correct one or more bit errors included in the redundancy data from the redundancy block 354, may detect and correct one or more bit errors included in the data from the blocks other than the first block 350, or a combination thereof. The ECC engine 122 may provide the redundancy decoder 340 with corrected versions of the redundancy data from the redundancy block 354 and/or the data from the blocks other than the first block 350. Using the corrected versions of the redundancy data from the redundancy block 354 or the data from the blocks other than the first block 350, the redundancy decoder 340 may output the recovered block data 312.

During operation of the data storage device 102, as illustrated by the second illustrative example designated 370, the controller 120 may determine that a random error occurred in association with a read operation performed on the first page (P1_1) of the first block 350. For example, the data read from the first page (P1_1) of the first block 350 may be provided to the ECC engine 122 and the ECC engine 122 may detect one or more bit errors associated with the data read from the first page (P1_1) of the first block 350. If the ECC engine 122 cannot correct the one or more bit errors associated with the data read from the first page (P1_1) of the first block 350, additional ECC-type redundancy data may be used. For example, the redundancy decoder 340 may determine what mode, such as the first mode 126 or the second mode 128, was the active mode when data was stored into the first block 350. To illustrate, the redundancy decoder 340 may access the tracking table 148 and may determine that the second mode 128 was the active mode when the data was stored into the first block 350.

The redundancy decoder 340 may receive redundancy data (e.g., intra-block redundancy data) stored at the redundancy block 354 in addition to the data read from the first page (P1_1) of the first block 350. The redundancy data from the redundancy block 354 and the first page (P1_1) of the first block 350 may be provided to the ECC-type decoder 344. The ECC-type decoder 344 may parse the redundancy data to identify a portion (e.g., a section) of the redundancy data that corresponds to the first page (P1_1) of the first block 350. In other implementations, the redundancy data (e.g., the first page (PN_1) from the redundancy block 354 may be provided to the ECC engine 122 to be validated prior to being used by the ECC-type decoder 344.

In some implementations, the ECC-type decoder 344 may generate corrected data for the first page (P1_1) of the first block 350 by performing a XOR operation using the redundancy data (e.g., the first page (PN_1)) from the redundancy block 354 and portions of the data read from the first page (P1_1) of the first block 350. For example, the ECC-type decoder 344 may divide the first page (P1_1) of the first block 350 into multiple sections and perform multiple XOR operations using a portion (e.g., a section) of the redundancy data (e.g., the first page (PN_1)) that corresponds to the first page (P1_1) of the first block 350. To illustrate, the first page (P1_1) of the first block 350 may be divided into four sections S1-S4 and the portion of the redundancy data (e.g., the first page (PN_1) may be a redundancy section R1. To generate the corrected data, the ECC-type decoder 344 may generate corrected sections for each of the four sections S1-S4 of the first page (P1_1) of the first block 350. For example, a first corrected section may be generated by performing an XOR operation on sections S2-S4 and the redundancy section R1. If the codeword formed using the first corrected section is not decodable by the ECC engine 122, a second corrected section may be generated by performing an XOR operation on sections S1, S3-S4 and the redundancy section R1. The corrected data for the first page (P1_1) of the first block 350 may be provided to the ECC engine 122 to validate the corrected data and/or to detect and correct one or more bit errors present in the corrected data. In other implementations, the redundancy data (e.g., the first page (PN_1) from the redundancy block 354 may be provided to the ECC engine 122 to be used as additional parity bits by the ECC engine 122 when decoding the first page (P1_1) of the first block 350.

In a particular embodiment, the redundancy data from the redundancy block 354, such as the first page (PN_1) of the redundancy block 354, may be provided to the ECC engine 122 prior to being provided to the redundancy decoder 340. For example, the ECC engine 122 may detect and correct one or more bit errors (based on random errors) associated with the redundancy data from the redundancy block 354 and may send the corrected redundancy data to the redundancy decoder 340.

In a particular embodiment, based on a read request to read the first page (P1_1) of the first block 350, the first page (P1_1) of the first block 350 and the redundancy page (e.g., the first page (PN_1)) from the redundancy block 354 are read. In another particular embodiment, the redundancy page (e.g., the first page (PN_1)) from the redundancy block 354 is read after the ECC engine 122 detects one or more bit errors associated with the first page (P1_1) of the first block 350.

By determining a mode (e.g., the first mode 126 or the second mode 128) that was set as the active mode during storage of particular data, the data storage device 102 may determine whether a particular redundancy block associated with the data stores inter-block redundancy data or intra-block redundancy data. For example, if the first mode 126 was the active mode when the particular data was stored, the particular redundancy block may store inter-block redundancy data associated with recovery from a physical error. As another example, if the second mode 128 was the active mode when the particular data was stored, the particular redundancy block may store intra-block redundancy data associated with recovery from a random error.

Figure 4:
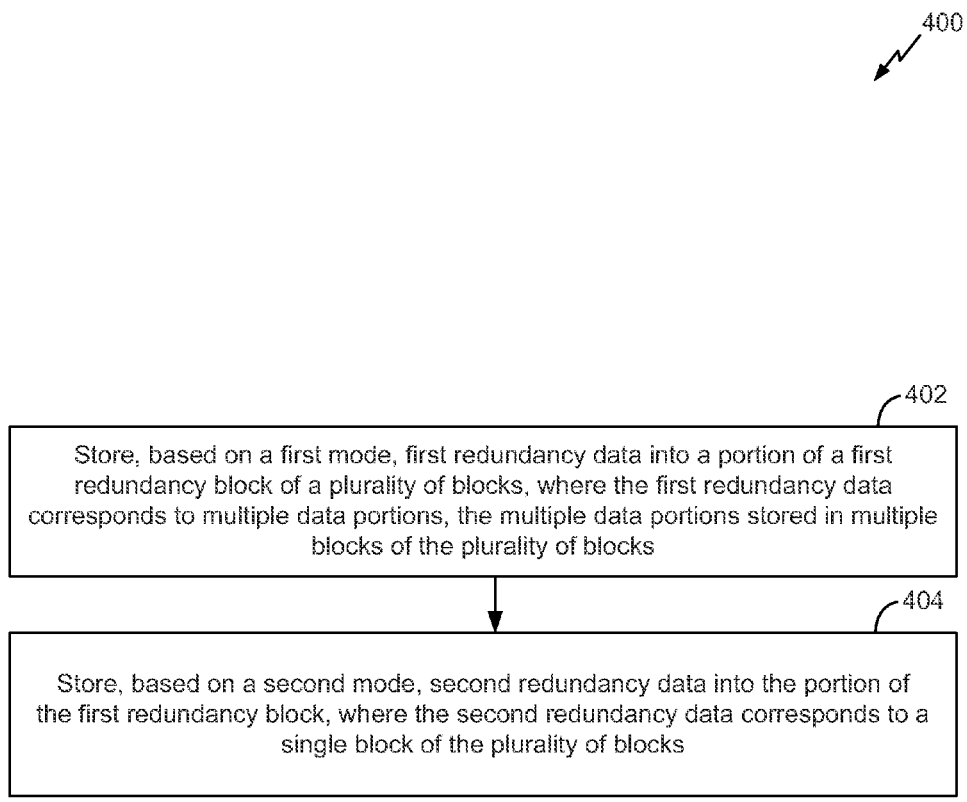
FIG. 4 is a flow diagram of a first embodiment of a method of storing redundancy data at a data storage device.

Referring to FIG. 4, a first illustrative embodiment of a method 400 of storing redundancy data is shown. For example, the method 400 may be performed by a controller of the data storage device, such as by the controller 120 (e.g., at the redundancy engine 140 or the redundancy encoder 164) of FIG. 1.

The method 400 includes storing, based on a first mode, first redundancy data into a portion of a first redundancy block of a plurality of blocks, where the first redundancy data corresponds to multiple data portions, the multiple data portions stored in multiple blocks of the plurality of blocks, at 402. For example, the first redundancy data may be associated with inter-block redundancy data. The portion of the first redundancy block may include or correspond to a page of the first redundancy block. The multiple data portions located on the multiple blocks may include or correspond to multiple pages located on the multiple blocks. The first redundancy data may be stored into a redundancy block of a memory of the data storage device, such as the non-volatile memory 104 of FIG. 1. The first mode may include or correspond to the first mode 126 of FIG. 1. The plurality of blocks may include or correspond to the plurality of memory blocks 162 of FIG. 1. The redundancy block may include or correspond to the redundancy block 188 of FIG. 1, the thirty-third block 256, the thirty-fourth block 258 of FIG. 2, or the redundancy block 354 of FIG. 3, as illustrative, non-limiting examples.

The method 400 also includes storing, based on a second mode, second redundancy data into the portion of the first redundancy block, where the second redundancy data corresponds to a single block of the plurality of blocks, at 404. The second redundancy data may further correspond to a plurality of pages located on the single block. For example, the second redundancy data may be associated with intra-block redundancy data. The second mode may include or correspond to the second mode 128 of FIG. 1. Accordingly, redundancy data (e.g., the first redundancy data or the second redundancy data) may be stored into the first redundancy block based on an active mode, such as a redundancy mode (e.g., the first mode or the second mode).

By storing redundancy data into the first redundancy block based on a mode (e.g., the first mode or the second mode), the data storage device may increase an amount of intra-block redundancy data during the life of the data storage device. The intra-block redundancy data may be used by the data storage device to resolve one or more bit errors caused by random errors, which may increase in number over the life of the data storage device.

Figure 5:
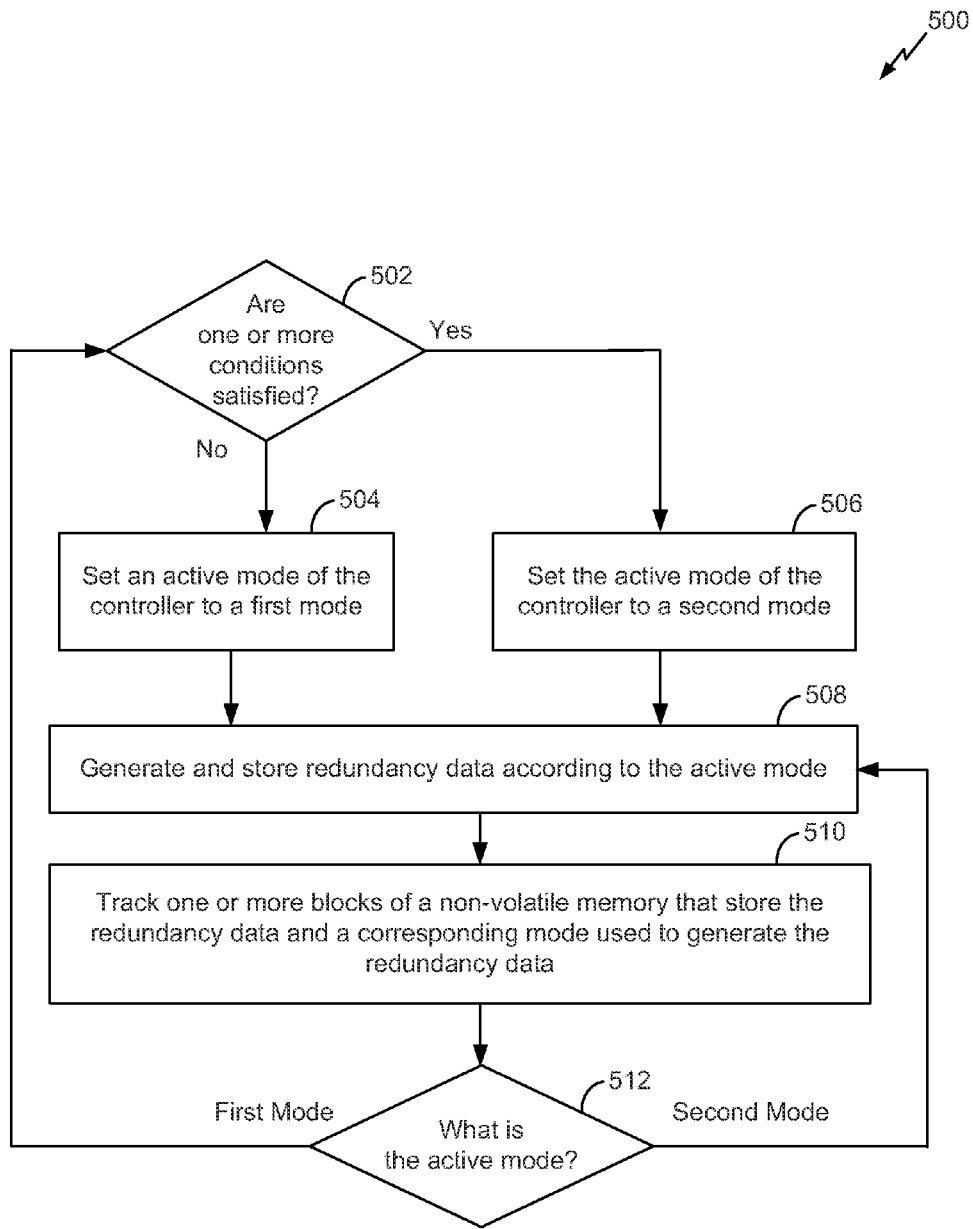
FIG. 5 is a flow diagram of a second embodiment of a method of storing redundancy data at a data storage device.

Referring to FIG. 5, a particular embodiment of a method 500 that may be performed at a data storage device to store redundancy data is depicted. For example, the method 500 may be performed by a controller of the data storage device, such as by the controller 120 (e.g., at the redundancy engine 140 or the redundancy encoder 164) of FIG. 1.

The method 500 includes determining whether one or more conditions are satisfied, at 502. The one or more conditions may be associated with an indication that a number or rate of random errors is increasing. For example, the one or more conditions may be associated with a number of write/erase (W/E) cycles, a bit error rate (BER) value, a defect detection rate, or a combination thereof. To illustrate, the one or more conditions may be associated with a metric, such as the metric 142 of FIG. 1. If the one or more conditions are not satisfied, the method 500 may set an active mode of the controller to a first mode, at 504. The first mode may include or correspond to the first mode 126 of FIG. 1. After setting the active mode to the first mode, the method 500 may advance to 508. If the one or more conditions are satisfied, the method 500 may set the active mode of the controller to a second mode, at 506. The second mode may include or correspond to the second mode 128 of FIG. 1. After setting the active mode to the second mode, the method 500 may advance to 508.

The method 500 may further include generating and storing redundancy data according to the active mode, at 508. The redundancy data may be generated by the ECC engine 122 or the redundancy encoder 164 of FIG. 1. The redundancy data may be stored into a redundancy block of a memory of the data storage device, such as the non-volatile memory 104 of the data storage device 102 of FIG. 1. The memory may include a plurality of blocks, such as the plurality of memory blocks 162 of FIG. 1. The redundancy block may include or correspond to the redundancy block 188 of FIG. 1, the thirty-third block 256, the thirty-fourth block 258 of FIG. 2, or the redundancy block 354 of FIG. 3, as illustrative, non-limiting examples.

The method 500 may also include tracking one or more blocks of the non-volatile memory that store the redundancy data and a corresponding mode used to generate the redundancy data, at 510. The one or more blocks of the non-volatile memory that store the redundancy data may be tracked using a tracking table, such as the tracking table 148 of FIG. 1.

The method 500 may include determining what mode is the active mode, at 512. If the active mode is the first mode, the method 500 may advance to 502. If the active mode is the second mode, the method 500 may advance to 508.

By setting the active mode based on the one or more conditions associated with the data storage device, the active mode may be dynamically set. Additionally, the active mode may change between the first mode and the second mode over a life of the data storage device. Accordingly, as the data storage device ages and a frequency of random errors increases, the active mode may change from the first mode (e.g., RAID-type redundancy) associated with inter-block redundancy data to the second mode (e.g., ECC-type redundancy) associated with intra-block redundancy data.

The method 400 of FIG. 4 and/or the method 500 of FIG. 5 may be initiated or controlled by an application-specific integrated circuit (ASIC), a processing unit, such as a central processing unit (CPU), a digital signal processor (DSP), a controller, another hardware device, a firmware device, a field-programmable gate array (FPGA) device, or any combination thereof. As an example, the method 400 of FIG. 4 and/or the method 500 of FIG. 5 can be initiated or controlled by one or more processors included in or coupled to the data storage device 102 of FIG. 1, such as one or more processors included in or coupled to the controller 120 of FIG. 1.

A controller configured to perform the method 400 of FIG. 4 and/or the method 500 of FIG. 5 may be able to advantageously store redundancy data according to one or more modes. Although various components of the data storage device 102 depicted herein are illustrated as block components and described in general terms, such components may include one or more microprocessors, state machines, or other circuits configured to enable the controller 120, the redundancy encoder 164, and/or the redundancy engine 140 of FIG. 1 to perform operations described herein. One or more aspects of the controller 120, the redundancy encoder 164, and/or redundancy engine 140 may be implemented using a microprocessor or microcontroller programmed to perform operations described herein, such as one or more operations of the method 400 of FIG. 4, the method 500 of FIG. 5, or a combination thereof. In a particular embodiment, the controller 120, the redundancy encoder 164, and/or the redundancy engine 140 includes a processor executing instructions that are stored at the non-volatile memory 104. Alternatively or additionally, executable instructions that are executed by the processor may be stored at a separate memory location that is not part of the non-volatile memory 104, such as at a read-only memory (ROM).

In an illustrative example, the processor may execute the instructions to store, based on a first mode, first redundancy data into a page of a first redundancy block of a plurality of blocks, where the first redundancy data corresponds to multiple pages located on multiple blocks of the plurality of blocks. The instructions to store the first redundancy data may include instructions to determine whether one or more conditions are satisfied, instructions to set an active mode to the first mode, instructions to generate the first redundancy data based on the first mode, instructions to write the first redundancy data to a location of a memory, and/or instructions to update a tracking table to identify the location of the first redundancy data and to identify that the first redundancy data was generated based on the first mode, as illustrative, non-limiting examples. The processor may execute instructions to store, based on a second mode, second redundancy data into the page of the first redundancy block, where the second redundancy data corresponds to a plurality of pages located on a single block of the plurality of blocks. The instructions may include instructions to determine whether the one or more conditions are satisfied, instructions to set the active mode to the second mode, instructions to generate the second redundancy data based on the second mode, instructions to write the second redundancy data to the location of the memory, and/or instructions to update the tracking table to identify the location of the second redundancy data and to identify that the second redundancy data was generated based on the second mode, as illustrative, non-limiting examples.

The data storage device 102 may be attached to or embedded within one or more host devices, such as within a housing of a host communication device, which may correspond to the host device 130. The data storage device 102 may be within a packaged apparatus such as a wireless telephone, a personal digital assistant (PDA), a gaming device or console, a portable navigation device, a computer device (e.g., a tablet or a laptop), or other device that uses internal non-volatile memory. However, in other embodiments, the data storage device 102 may be a portable device configured to be selectively coupled to one or more external devices, such as the host device 130. For example, the data storage device 102 may be a removable device such as a Universal Serial Bus (USB) flash drive or a removable memory card, as illustrative examples.

The host device 130 may correspond to a mobile telephone, a music player, a video player, a gaming device or console, an electronic book reader, a personal digital assistant (PDA), a computer, such as a laptop, a tablet, or a notebook computer, a portable navigation device, another electronic device, or a combination thereof. The host device 130 may communicate via a host controller, which may enable the host device 130 to communicate with the data storage device 102. The host device 130 may operate in compliance with a JEDEC Solid State Technology Association industry specification, such as an embedded MultiMedia Card (eMMC) specification or a Universal Flash Storage (UFS) Host Controller Interface specification. The host device 130 may operate in compliance with one or more other specifications, such as a Secure Digital (SD) Host Controller specification, as an illustrative example. Alternatively, the host device 130 may communicate with the data storage device 102 in accordance with another communication protocol.

The data storage device 102 may be configured to be coupled to the host device 130 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a Compact-Flash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

Semiconductor memory devices, such as the memory 104, include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., in a NOR memory array. NAND and NOR memory configurations described have been presented as examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor material, such as silicon.

The memory elements may be arranged in the single memory device level in an ordered array, such as in a plurality of rows and/or columns. However, the memory elements may be arranged in non-regular or non-orthogonal configurations. The memory elements may each have two or more electrodes or contact lines, such as bit lines and wordlines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration (e.g., in an x-z plane), resulting in a three dimensional arrangement of memory elements with elements arranged on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material, such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. To illustrate, each of the memory device levels may have a corresponding substrate thinned or removed before stacking the memory device levels to form memory arrays. Because each of the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

In some implementations, the non-volatile memory 104 is a non-volatile memory having a three-dimensional (3D) memory configuration that is monolithically formed in one or more physical levels of arrays of memory cells having an active area disposed above a silicon substrate. The active area of a memory cell may be an area of the memory cell that is conductively throttled by a charge trap portion of the memory cell. The data storage device 120 includes circuitry, such as the read/write circuitry 106, as an illustrative, non-limiting example, associated with operation of the memory cells.

Associated circuitry is typically used for operation of the memory elements and for communication with the memory elements. As non-limiting examples, memory devices may have circuitry for controlling and driving memory elements to perform functions such as programming and reading. The associated circuitry may be on the same substrate as the memory elements and/or on a separate substrate. For example, a controller for memory read-write operations may be located on a separate controller chip and/or on the same substrate as the memory elements One of skill in the art will recognize that this disclosure is not limited to the two dimensional and three dimensional structures described but cover all relevant memory structures within the spirit and scope of the disclosure as described herein and as understood by one of skill in the art.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data storage device comprising:
    a non-volatile memory including a plurality of blocks; and
    a controller operatively coupled to the non-volatile memory, wherein, when the controller is configured to operate according to a first mode, a first portion of a first redundancy block of the plurality of blocks stores first redundancy data corresponding to a first group of multiple first data portions, the multiple first data portions stored in multiple blocks of the plurality of blocks, and wherein, when the controller is configured to operate according to a second mode, the first portion of the first redundancy block stores second redundancy data corresponding to a single block of the multiple blocks.

2. The data storage device of claim 1, wherein the first mode is associated with a first type of redundancy data, the first type of redundancy data corresponding to a redundant array of independent disks-type (RAID-type) to enable recovery of data from a defective block, wherein the second mode is associated with a second type of redundancy data, the second type of redundancy data corresponding to an error correcting code-type (ECC-type) to enable recovery of data from bit errors, and wherein the controller operates according to the first mode prior to operating according to the second mode.

3. The data storage device of claim 1, wherein the controller is further configured to transition from operating according to the first mode to the second mode based on a number of write/erase cycles, a bit error rate (BER) value, a defect detection rate, or a combination thereof.

4. The data storage device of claim 1, wherein the first redundancy data includes an exclusive-or (XOR) result generated based on the first group of the multiple first data portions being XORed together.

5. The data storage device of claim 1, wherein a second portion of a second redundancy block of the plurality of blocks stores third redundancy data corresponding to a second group of multiple second data portions, the multiple second data portions stored in the multiple blocks.

6. The data storage device of claim 5, wherein, when the controller is configured to operate according to the first mode, the first redundancy data includes a first exclusive-or (XOR) result generated based on the first group of the multiple first data portions combined via a XOR operation and the third redundancy data includes a second XOR result generated based on the second group of the multiple second data portions being XORed together.

7. The data storage device of claim 5, wherein the first redundancy data includes a first exclusive-or (XOR) result generated based on the first group of the multiple first data portions combined via a XOR operation and the third redundancy data is computed based on an error correcting code (ECC) code.

8. The data storage device of claim 1, wherein the non-volatile memory includes a three-dimensional (3D) memory configuration that is monolithically formed in one or more physical levels of arrays of memory cells having an active area disposed above a silicon substrate, and wherein the data storage device includes circuitry associated with operation of the memory cells.

9. A device comprising:
    a non-volatile memory including a plurality of blocks; and
    a controller coupled to the non-volatile memory, the controller configured to store redundant array of independent disks-type (RAID-type) data in a portion of a redundancy block and, in response to detecting a condition, to store error- correcting code-type (ECC-type) data in the portion of the redundancy block.

10. The device of claim 9, wherein the RAID-type data includes redundancy data for multiple blocks of the plurality of blocks, and wherein the ECC-type data includes redundancy data for a single block of the plurality of blocks.

11. The device of claim 9, wherein the condition corresponds to a number of write/erase cycles satisfying a threshold.

12. The device of claim 9, wherein the condition corresponds to a bit error rate (BER) value satisfying a threshold.

13. The device of claim 9, wherein the condition corresponds to a defect detection rate satisfying a threshold.

14. A method comprising:
    in a data storage device including a controller and a non-volatile memory, wherein the non-volatile memory includes a plurality of blocks, performing:
    storing, based on a first mode, first redundancy data into a first portion of a first redundancy block of the plurality of blocks, wherein the first redundancy data corresponds to multiple first data portions, the multiple first data portions stored in multiple blocks of the plurality of blocks; and
    storing, based on a second mode, second redundancy data into the first portion of the first redundancy block, wherein the second redundancy data corresponds to a single block of the multiple blocks.

15. The method of claim 14, further comprising tracking which blocks of the plurality of blocks include data generated in accordance with the first mode or the second mode.

16. The method of claim 14, further comprising changing from the first mode to the second mode based on a determination that a number of write/erase cycles is greater than or equal to a threshold number of cycles.

17. The method of claim 14, further comprising changing from the first mode to the second mode based on a determination that a bit error rate (BER) value is greater than or equal to a threshold.

18. The method of claim 14, further comprising changing from the first mode to the second mode based on a determination that a defect detection rate associated with the non-volatile memory is less than or equal to threshold rate.

19. The method of claim 14, further comprising:
receiving first data to be stored at the non-volatile memory; and
when the controller operates according to the first mode, generating the first redundancy data based on the first data.

20. The method of claim 19, further comprising:
receiving second data to be stored at the non-volatile memory; and
when the controller operates according to the second mode, generating the second redundancy data based on the second data.

21. The method of claim 14, further comprising:
dividing a particular page of the single block into a plurality of sections; and
generating a particular portion of the second redundancy data based on combining each section of the plurality of sections via an exclusive-or (XOR) operation.

22. The method of claim 14, further comprising dividing a page of the first redundancy block into a plurality of sections, wherein each section of the page corresponds to a different page of the single block.

23. The method of claim 14, wherein each data portion of the multiple first data portions comprises an error correcting code (ECC) codeword having a first number of parity bits, and wherein the second redundancy data is associated with additional ECC parity bits to extend the ECC codeword to have a second number of parity bits greater than the first number of parity bits.

24. The method of claim 23, wherein the ECC codeword is a low-density parity check (LDPC) codeword.

* * * * *